United States Patent
Hindman et al.

[11] Patent Number: 6,160,858
[45] Date of Patent: Dec. 12, 2000

[54] MSK SIGNAL PROCESSING IN A GPS CORRELATOR CHANNEL

[75] Inventors: David L. Hindman, Austin; Clarence W. Fowler, Elgin; Gerald D. Powell, Austin; David A. Fowler, Elgin; David L. Hirsch, Austin; Charles L. Ladwig, IV, Round Rock, all of Tex.

[73] Assignee: Starlink, Inc., Austin, Tex.

[21] Appl. No.: 08/905,615

[22] Filed: Aug. 4, 1997

[51] Int. Cl.[7] ........................................... H03D 3/00
[52] U.S. Cl. ........................... 375/336; 375/274; 375/305
[58] Field of Search ..................... 375/336, 334, 375/316, 322, 324, 259, 271, 272, 274, 305, 303, 302, 295

[56] References Cited

U.S. PATENT DOCUMENTS

| | | | |
|---|---|---|---|
| 4,359,692 | 11/1982 | Ryan | 329/50 |
| 4,384,357 | 5/1983 | deBuda et al. | 375/81 |
| 4,445,094 | 4/1984 | Ryan | 329/50 |
| 4,755,761 | 7/1988 | Ray, Jr. | 329/50 |
| 5,285,742 | 2/1994 | Leonard et al. | 375/1 |
| 5,309,480 | 5/1994 | Powell, II et al. | 375/90 |
| 5,523,761 | 6/1996 | Gildea | 342/357 |
| 5,612,975 | 3/1997 | Becker et al. | 375/319 |
| 5,628,049 | 5/1997 | Suemitsu | 455/11.1 |
| 5,629,956 | 5/1997 | Durrant et al. | 375/208 |
| 5,741,509 | 4/1998 | Wood et al. | 375/350 |

OTHER PUBLICATIONS

Pianka, et al., "Medium Frequency DGPS Data Link" (Sep. 13, 1991).

Product Brief entitled "GP2021–GPS 12 Channel Correlator with Microprocessor Support Functions" (Dec. 1994) (pp. 1–8).

Sage, "Minimum Shift Keying Detection Algorithm" (No date).

*Primary Examiner*—William Luther
*Attorney, Agent, or Firm*—Patrick Stellitano

[57] ABSTRACT

A method and apparatus for demodulating and decoding an MSK signal utilizing synchronous accumulation and simultaneous synchronization of reference carrier and MSK data clocks enables a GPS correlator channel in a multi-channel GPS receiver to be used for processing MSK signals. The PRN code epochs are synchronized with the MSK data clocks and the process of de-spreading with a PRN code is disabled in order to obtain coherent MSK demodulation without corrupting the MSK signal with a PRN code within the channel.

55 Claims, 9 Drawing Sheets

Fig. 8a

Software Listing (C Language)

```c
/* Demonstration of MSK demodulation with a GPS correlator          */ include <conio.h>
include <dos.h>
#include <graphics.h>
#include <math.h>
#include <stdio.h>
include <stdlib.h> define eps    1.0E-6
define TwoPI  6.283185307
define PIDiv2 1.570796327 struct {                           /* Simulated signal state                           */
    double Freq;                   /* Frequency of final IF from MSK front end         */
    double Phase;                  /* Phase of MSK final IF                            */
    double BitRate;                /* MSK bit rate (bits/sec)                          */
    double TimeInBit;              /* Time into current MSK bit, seconds               */
    double SidebandShift;          /* Data sideband deviation from center, Hz          */
    double BitDuration;            /* MSK data bit duration, seconds                   */
    int DB[3];                     /* Three previous MSK data bits (0/1)               */
} SS;

struct {                           /* Simulated GPS correlator state                   */
    double BitRate;                /* Initial bit rate setting for correlator          */
    double CarrDCOFreq;            /* Carrier DCO frequency control, Hz                */
    double CarrDCOPhase;           /* Carrier DCO phase, radians                       */
    double CodeDCOFreq;            /* Code DCO frequency control, epochs/sec           */
    double I;                      /* In-phase accum., dumped at code epoch            */
    double Q;                      /* In-quadrature accum., dumped at epoch            */
} CS;

struct {                           /* Demodulator state */
    int EpochsPerHalfBit;          /* No. of C/A code epochs per MSK half bit          */
    int EpochstoHalfBit;           /* No. of epochs remaining in curr half bit         */
    int HalfBitCounter;            /* MSK Half-bit clock                               */
    int sgnsinDCLK;                /* Sign of sin(Data Clock)                          */
    int sgncosDCLK;                /* Sign of cos(Data Clock)                          */
    double ISum;                   /* "I" accumulated over one data bit                */
    double QSum;                   /* "Q" accumulated over one data bit                */
    double OddSum;                 /* 2-bit I accum. ending at end of odd bit          */
    double EvenSum;                /* 2-bit Q accum. ending at end of even bit         */
    int Odd;                       /* 1=last Odd sum was positive, else 0              */
    int Even;                      /* 1=last Even sum was positive, else 0             */
    int DemodulatedDataBit;        /* Demodulated MSK data bit 0/1                     */
    double CarrierClockError;      /* Accumulated carrier clock error signal           */
    double DataClockError;         /* Data clock error signal                          */
} DS;

/* Correlate two sinusoidal signals from time 0 to T.                                  */
double Corr(double F1, double PH1, double F2, double PH2, double T){
    double S,D;
    if(fabs(F1-F2)<eps) return T*cos(PH1-PH2)/2.0
        - (sin(2.0*TwoPI*F1*T+PH1+PH2)-sin(PH1+PH2))/(4.0*TwoPI*F1);
    else{
        S = TwoPI*(F1+F2);  D = TwoPI*(F1-F2);
        return (sin(D*T+PH1-PH2)-sin(PH1-PH2))/(2.0*D)
            - (sin(S*T+PH1+PH2)-sin(PH1+PH2))/(2.0*S);
    }
} double DBTotal,DBCorrect;  /* Data bits received, and received correctly */
double CE,OldCE,DE,OldDE;  /* Carrier and data clock error signals       */
```

Fig. 8b

```c
void main(void){
  double TimeToEpoch,DT,Freq;

/* Set up the simulation parameters (user settings)           */
  SS.Freq = 4880.0;      /* Simulated signal: MSK final IF, Hz   */
  SS.BitRate = 200.0;    /* Simulated signal: MSK bit rate       */
  CS.CarrDCOFreq = 4882.0; /* Initial receiver carrier DCO setting, Hz */
  CS.BitRate = 199.5;    /* Initial receiver bit rate setting, bps */

SS.BitDuration = 1.0/SS.BitRate;    /* Other initializations   */
  SS.SidebandShift = SS.BitRate/4.0;
  DS.EpochsPerHalfBit = 500 / CS.BitRate;
  CS.CodeDCOFreq = 2*CS.BitRate*DS.EpochsPerHalfBit;
  DS.EpochstoHalfBit = DS.EpochsPerHalfBit;
  DS.sgncosDCLK = DS.sgnsinDCLK = 1;

while(1){ /* Epoch-by-epoch simulation of dumps from GPS correlator  */
    CS.I = CS.Q = DT = 0;
    TimeToEpoch=1.0/CS.CodeDCOFreq;
    while((TimeToEpoch-=DT)>eps){ /* Correlate until end of Code DCO epoch */
      Freq = SS.Freq + (SS.DB[0]? 1:-1)*SS.SidebandShift;
      DT = min((SS.BitDuration-SS.TimeInBit),TimeToEpoch);
      CS.I += Corr(Freq,SS.Phase,CS.CarrDCOFreq,CS.CarrDCOPhase,DT);
      CS.Q += Corr(Freq,SS.Phase,CS.CarrDCOFreq,CS.CarrDCOPhase+PIDiv2,DT);
      SS.Phase = fmod(SS.Phase+=TwoPI*DT*Freq,TwoPI);
      if((SS.TimeInBit+=DT) >= SS.BitDuration){
        SS.TimeInBit -= SS.BitDuration;
        SS.DB[2]=SS.DB[1]; SS.DB[1]=SS.DB[0]; SS.DB[0]=rand()&1;
      }
      CS.CarrDCOPhase = fmod(CS.CarrDCOPhase+=TwoPI*DT*CS.CarrDCOFreq,TwoPI);
    }

/* Update accumulations                                      */
    DS.CarrierClockError += DS.sgncosDCLK*CS.I*CS.Q;
    DS.ISum+=CS.I; DS.QSum+=CS.Q; DS.OddSum+=CS.I; DS.EvenSum+=CS.Q;

if(--DS.EpochstoHalfBit==0){
      /* Advance the MSK data clock and generate dump signals    */
      DS.EpochstoHalfBit = DS.EpochsPerHalfBit;
      DS.HalfBitCounter++;
      DS.sgnsinDCLK = (DS.HalfBitCounter&2)? -1: 1;
      DS.sgncosDCLK = (DS.HalfBitCounter+1)&2? -1: 1;
      if((DS.HalfBitCounter&1)==0){
        OldCE=CE; CE=1000000.0*DS.CarrierClockError;
        DS.CarrierClockError = 0.0;
        CS.CarrDCOFreq -= CE-OldCE + CE/32.0;
        DS.DataClockError = DS.sgnsinDCLK * (fabs(DS.ISum)-fabs(DS.QSum));
        OldDE=DE; DE=100.0*DS.DataClockError;
        CS.CodeDCOFreq -= DE-OldDE + DE/64.0;
        if((DS.HalfBitCounter&2)==0){
          DS.Odd = DS.OddSum>=0? 1: 0;
          DS.OddSum = 0.0;
        }
        else{
          DS.Even = DS.EvenSum>=0? 1: 0;
          DS.EvenSum = 0.0;
        }
        DS.DemodulatedDataBit = (DS.sgnsinDCLK<0) ^ DS.Odd ^ DS.Even;
        if(DS.DemodulatedDataBit == SS.DB[2]) DBCorrect += 1.0;
        if((DBTotal+=1) >= 1000){
          printf("Data quality %5.1lf\%\n",DBCorrect/DBTotal*100.0);
          DBCorrect = DBTotal = 0.0;
        }
        DS.ISum = DS.QSum = 0;
      }
    }
    if(kbhit()){getch(); break;}
  }
}
```

MSK SIGNAL PROCESSING IN A GPS CORRELATOR CHANNEL

TECHNICAL FIELD

The present invention relates to methods and apparatus for processing an MSK signal. The method enables an MSK signal to be processed utilizing a Global Positioning System receiver channel.

BACKGROUND OF THE INVENTION

The Global Positioning System (GPS) is a radio navigation system comprised of a constellation of earth-orbiting satellites, each of which transmits a separate signal. The satellite signals carry information that allows GPS receivers to compute satellite positions in real time, and also to measure the time required for signals to travel from each satellite to the receiver. By setting up and solving appropriate systems of simultaneous equations, GPS receivers combine such measurements from several satellites to obtain good estimates of the receiver position, velocity, and time.

GPS receiver accuracy is affected by measurement noise. Some noise sources are natural and some are artificial. Natural noise sources include ionospheric and tropospheric signal delays and refraction, receiver thermal noise, multipath effects, and unmodelled satellite orbital perturbations. Artificial noise sources include the effect of Selective Availability, which is the intentional dithering of GPS signals to degrade the positioning accuracy obtained by non-military users.

Most of the GPS measurement noise sources affect all receivers in the same way. The effect of such common-mode errors can be removed by measuring the errors with a specially constructed GPS receiver at a precisely surveyed location, and providing the resulting "differential corrections" to other GPS receivers which are operating nearby. Using this method, real-time GPS positioning accuracy can be improved from 100 meters to 3 meters or even better.

Differential GPS (DGPS) corrections are provided as a public service in many areas of the world by government-sponsored MSK beacon broadcasts in the 283.5–325.0 kHz radio location band. GPS users which incorporate differential corrections from MSK beacons are therefore required to receive and process two very different types of radio signals: spread spectrum GPS in the UHF band and MSK beacon broadcasts in the medium frequency (MF) band.

There are alternative means by which differential corrections may be conveyed from a reference receiver. These include VHF and UHF radio modems, satellite broadcasts, and other forms of telecommunication. These alternative methods for distributing differential corrections will not be discussed here.

Current DGPS receiver systems employ functionally separate receiver subsystems to process the GPS satellite and MSK beacon signals. This is so because the satellite signals and the beacon signals have different processing requirements. In particular, the satellite signal is a BPSK (binary phase shift keyed) signal encoded with a pseudo-random noise (PRN) code and transmitted on an L-Band carrier frequency of 1575.42 megahertz (MHz). In contrast, the beacon signal is an uncoded MSK (minimum shift keyed) signal transmitted on a carrier frequency in the band of 283.5 to 325.0 kilohertz (kHz). This band is divided into channels separated into 500 Hz steps. Further, the satellite data is transmitted at 50 data bits per second (bps), whereas the beacon data is transmitted at 25, 50, 100, or 200 bps.

Separate RF subsystems are required for processing the two types of signals. An RF subsystem typically comprises an antenna, a pre-selection filter and a low noise amplifier followed by frequency conversion and/or bandpass filtering stages. The pre-selection filter is designed to reject unwanted signals outside the band. The low noise amplifier amplifies the incoming signal. Typically, the received signal is converted to an intermediate frequency (IF) by mixing it with a local oscillator (LO) signal. The LO frequency is chosen to be the difference between the carrier frequency of the incoming signal and the desired intermediate frequency (IF). Depending on the implementations, several such frequency conversion steps may occur. The IF is filtered by a bandpass filter and input to an analog-to-digital (A/D) converter. The A/D converter comprises a system for sampling the signal and quantizing it to an appropriate number of binary digits. The output of the RF subsystem is further processed by the receiver subsystem.

A GPS receiver subsystem contains one or more correlator channels for processing the signals of multiple satellites. Each channel is identical in its operation and all of them are controlled by a microprocessor in the GPS receiver subsystem. A GPS correlator channel typically comprises a complex mixer, a digitally controlled oscillator (DCO) for generating a reference carrier (carrier DCO), and a correlator. The correlator comprises a code generator for generating a PRN code, a code DCO, and code mixers for mixing the incoming signal with the PRN code, and accumulators for accumulating the output of the code mixers. The incoming signal from the RF subsystem is input into the complex mixer. The complex mixer mixes the incoming signal with a reference carrier generated by the carrier DCO. The reference carrier is also phase shifted by 90 degrees and separately mixed with the incoming signal. This produces two signals: one in phase with the reference carrier (the I signal), and one in quadrature with the reference carrier (the Q signal). The reference carrier frequency is adjusted to be equal to the IF of the input signal so that the I and Q signals are at baseband. In an alternative configuration, the RF subsystem would comprise a complex mixer to produce I and Q signals at an intermediate frequency. The GPS receiver would then be configured to separately mix the intermediate frequency I and Q signals with the reference carrier, without introducing the 90° phase shift.

The I and Q signals are then correlated with a PRN code generated by the code generator. The code generator of a GPS receiver channel typically is capable of generating various types of PRN codes such as C/A, GLONASS, WAAS, pseudolite, P, Y, and Inmarsat. Each type of PRN code is comprised of finite duration sequences. The particular sequence generated by the code generator is controlled by the GPS receiver processor. The duration of the sequence, called the epoch, and the rate at which the PRN code bits are generated, called the chipping rate, are controlled by the code DCO. In particular, the epoch of the C/A code is one millisecond, and the chipping rate is 1.023 Mhz.

The correlation process comprises mixing the incoming signal with the generated code and accumulating the result over the duration of an epoch. At the end of the epoch, the accumulation is dumped to output the result. This accumulate-and-dump process occurs over each epoch. Epoch accumulations are then combined to form data bit detection integrals, so that the data stream can be recovered by the detector and decoder.

The PRN codes generated by the code generator have the characteristic that the correlation of two identical code sequences is a relatively high maximum value when there is no time delay between the two sequences. The correlation value falls to a relatively low value rapidly as the time delay between the sequences increases. In contrast, the correlation of two different code sequences is always a relatively low value. If a sequence impressed on an information bearing signal is the same sequence generated by the code generator, and if the time delay between the sequences is very small, the output signal from the correlator at the end of each epoch will be nearly equal to the average value of the information bearing signal during the epoch in which the correlation occurred. If this condition is maintained, the correlation process will reconstruct the unencoded signal and the PRN code will be removed from the signal. Conversely, if the sequence impressed on the incoming signal is not the same sequence generated by the code generator, or if a significant delay between the sequences exists, the output from the correlator will be nearly zero, and the signal information will be lost.

The purpose of the correlation process, which is called de-spreading, is to remove the PRN code from the incoming signal and to differentiate between the signal from one satellite and the signals from all the other satellites. Each channel of the GPS receiver used to receive satellite information receives a composite signal comprised of the transmissions from many satellites. However, each satellite transmits a different PRN code. By correlating the composite signal with a code sequence that replicates the code sequence transmitted by a particular satellite, a correlator channel is able to select the signal of one satellite and reject all others. Since each channel contains its own code generator and code DCO, each channel can process the signal from a different satellite.

The signals from each channel are then decoded and combined to solve a system of equations to determine receiver position and precise time. This solution is typically accomplished by a recursive algorithm such as a Kalman filter in the GPS receiver processor.

In conventional DGPS, a separate MSK receiver subsystem processes the MSK signal from the local beacon. An MSK signal is one in which binary data is impressed upon the carrier by a discrete shift in frequency above or below the center frequency according to whether the data bit of the transmitted signal information is high or low. A high bit shifting the frequency up would cause the MSK signal to advance in phase, whereas a low bit shifting the frequency down would cause the MSK signal to retard in phase relative to the center frequency. These frequency shifts are caused to occur without any discontinuity in phase. The separation between the upper and lower sideband frequencies is one half the data bit rate. Consequently, the phase shift occurring during an interval of one data bit is 90 degrees.

It is important to note that only the upper and lower data sideband frequencies are actually transmitted in an MSK broadcast. The center frequency itself is not transmitted and is thus a suppressed carrier. Since the information content of an MSK signal can be expressed in terms of phase movement of the signal with respect to the suppressed carrier, it is sometimes convenient (but not always necessary) to explicitly reconstruct the suppressed carrier in the receiver.

A variety of coherent demodulation schemes for MSK signals have been developed. These methods differ substantially from the GPS demodulation scheme because of the different characteristics of the two types of signals. Thus, a separate MSK receiver channel is typically used in a differential GPS receiver for processing the MSK signal. This substantially increases the cost and complexity of a DGPS receiver when compared to a non-differential GPS receiver.

As previously noted, modern GPS receivers have multiple correlator channels to simultaneously demodulate data from multiple satellites. This is done because the GPS receiver position solution improves with an increase in the number of satellites used to supply satellite position data. However, not all of the channels available in a typical GPS receiver are always needed to compute the GPS solution. Thus, if a method could be developed to utilize one or more of the extra GPS receiver channels to process the MSK beacon signal, the separate MSK subsystem could be eliminated and its functions incorporated into the GPS receiver subsystem. This would result in a substantial reduction of system cost and complexity. Thus, a need exists for a method and apparatus for processing MSK signals in the correlator channels of a GPS receiver.

SUMMARY OF THE INVENTION

An object of the present invention is, therefore, to provide an improved apparatus and method for processing an MSK signal and for implementing the apparatus and method using a GPS correlator channel.

According to one aspect of the present invention, an MSK signal is converted to a signal to be mixed with a reference carrier. The converted MSK signal is mixed in a complex mixer with the reference carrier to produce a signal in phase with the reference carrier, the I signal, and a signal in quadrature with the reference signal, the Q signal. The reference carrier is synchronized with the center frequency (suppressed carrier) of the converted MSK signal so that the I and Q signals are at baseband. Both the I and Q signals are accumulated and output for decoding and further processing as needed. Accumulation intervals are controlled by a data clock that is synchronized with the data bit intervals of the incoming MSK signal data stream.

An advantage of this method of MSK demodulation is the reduction in hardware required, and the ability to perform more steps of the process by a microprocessor under the direction of software instructions. In analog systems, where receiver components introduce DC biases into the signal, demodulation by converting the signal to baseband is undesirable. In a digital system, however, the problem of unwanted DC biases does not exist, and baseband demodulation and synchronization are feasible. This facilitates the implementation of more receiver functions in a programmable digital processor. Utilization of a programmable processor increases system flexibility and reduces the cost of design and manufacture. Digital implementation also facilitates the synchronization of accumulations in the process of detecting carrier and data clock phase errors. This reduces noise and intersymbol interference without imposing narrow bandwidth constraints on the phase error detection loops. Further, the method of MSK signal processing disclosed herein enables the use of GPS correlator channels to process MSK signals.

According to another aspect of the invention, an MSK signal is converted to a signal to be input to a GPS correlator channel. Within the GPS correlator channel, the converted MSK signal is mixed with a reference carrier generated by the GPS carrier DCO to produce a signal in phase with the reference carrier and a signal in quadrature with the reference carrier. The reference carrier is synchronized with the center frequency of the converted MSK signal so that the I and Q signals are at baseband. The I and Q signals are input to the GPS receiver channel correlator. The process of de-spreading the incoming signal with a PRN code from the code generator is disabled so that the I and Q signals are not mixed with a PRN code. The I and Q signals are then accumulated for further processing. The accumulation intervals are controlled by the code DCO of the GPS receiver channel, which also is used to control the timing of an MSK data clock generator. The code DCO and the MSK data clocks are synchronized with the data bit intervals of the incoming MSK signal data stream.

Disablement of the de-spreading process can be accomplished in a variety of ways, including software control of the correlators, which allows any one or more of the GPS receiver channels to be selected for MSK signal processing. Software control to disable de-spreading can be accomplished, for example, by causing the code generator to output a constant sequence. Also, some GPS correlator components provide means for a constant value to be input to the code mixers, rather than the code generated by the code generator, in response to an input signal which may be sent by a processor controlled by software. An alternative is to manufacture a multi-channel GPS receiver, wherein one or more channels are configured so that de-spreading does not occur. A correlator may be disabled, for example, by hardwiring the input to the code mixers to a constant voltage.

An advantage to the present invention is the significant reduction in system complexity and cost associated with conventional systems. The method disclosed herein of processing an MSK signal may be employed to eliminate a separate MSK demodulator from the differential GPS receiver system. By using the complex mixer and accumulators of a GPS receiver channel and by disabling the de-spreading process, the separate MSK demodulator can be eliminated. Also, the synchronization and decoding steps can be performed by the GPS receiver signal processor. Consequently, separate MSK hardware or firmware to perform these steps is unnecessary. Also, communication overhead between the GPS receiver signal processor and a separate MSK receiver is eliminated. Moreover, the GPS receiver reference oscillator can be used as a system clock for the MSK signal processing functions, so that a separate crystal oscillator for an MSK receiver is not needed. The GPS receiver reference oscillator is typically more precise than what is provided in the typical MSK receiver. In addition, GPS receivers provide extremely accurate calibrations of their own reference oscillator frequency, and these calibrations can be used to improve MSK processing performance when that same oscillator is used by the MSK receiver subsystem. Since MSK signal acquisition time increases as the square of the initial frequency uncertainty, using the GPS timing reference decreases MSK signal acquisition time. Conversely, since DGPS beacon frequency accuracy is specified to be better than 0.001%, the MSK signal processed in a GPS channel can be used to perform a coarse calibration of the GPS reference oscillator.

The present invention achieves such a significant commonality of signal processing between GPS and MSK signals that the incremental cost of a Differential GPS receiver over a non-differential GPS receiver is substantially lowered. This means that the increased accuracy of the DGPS system will become more affordable.

These and other features, aspects, and advantages of the present invention will become better understood with reference to the following description, appended claims and drawings.

BRIEF DESCRIPTION OF THE DRAWINGS

FIGS. 8a and 8b are a simulation software source code listing.

DETAILED DESCRIPTION OF PREFERRED EMBODIMENTS

Figure 1:
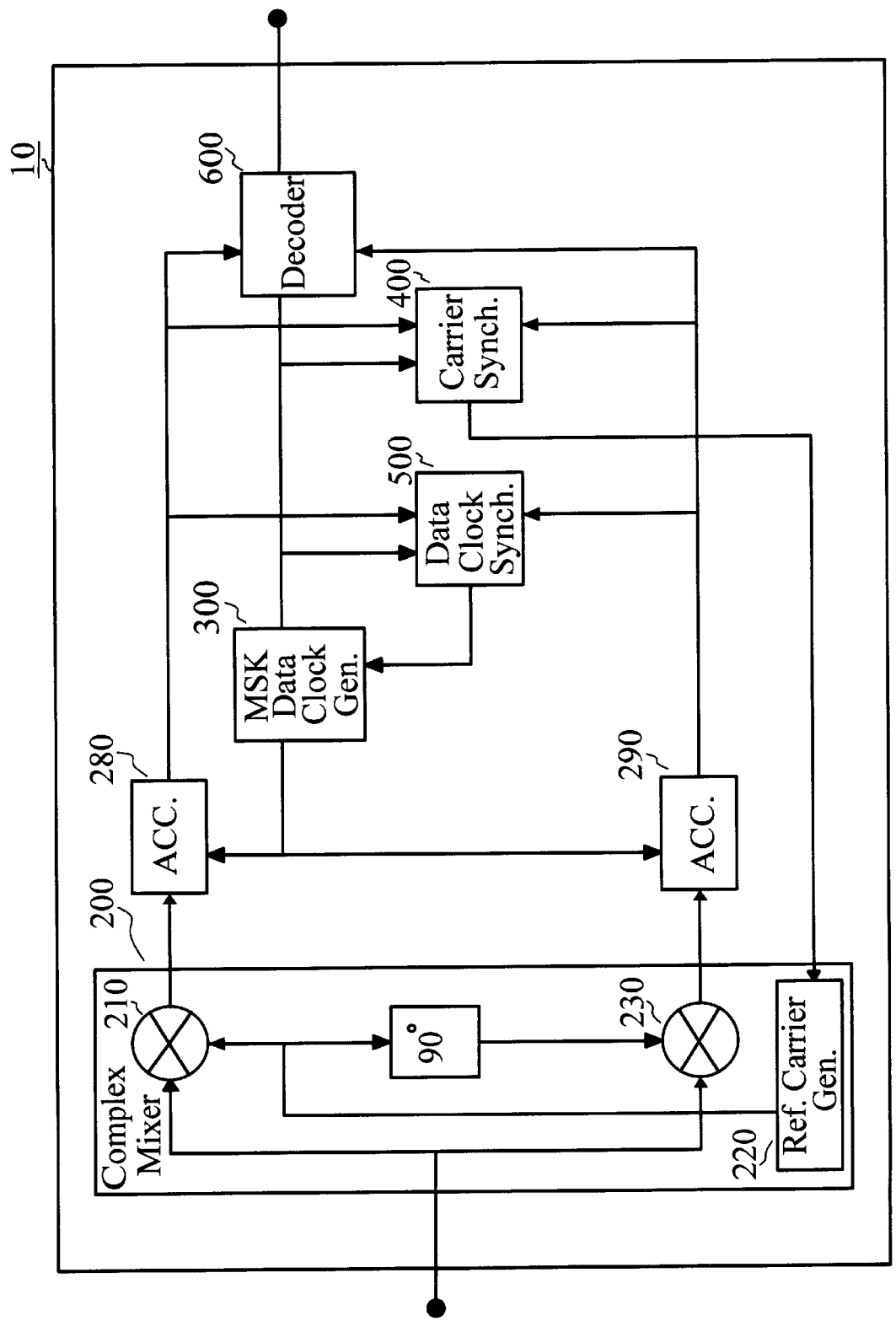
FIG. 1 is a block diagram of a preferred embodiment of an MSK signal processor.

Referring to FIG. 1, a preferred embodiment, depicted as system 10, comprises a complex mixer 200, an I signal accumulator 280, a Q signal accumulator 290, an MSK data clock generator 300, a carrier synchronizer 400, and a data clock synchronizer 500

Still referring to FIG. 1, an MSK input signal is received by complex mixer 200. The MSK input signal is mixed with a reference carrier generated by a reference carrier generator 220 in complex mixer 200. The reference carrier, which reconstructs the suppressed MSK carrier, is synchronized with the center frequency of the MSK input signal by carrier synchronizer 400. The output of complex mixer 200 is two signals that are accumulated by the I and Q signal accumulators 280 and 290. The accumulation intervals of these accumulators are controlled by MSK data clock generator 300. MSK data clock generator 300 is synchronized with the data bit intervals of the MSK signal by data clock synchronizer 500.

Figure 2:
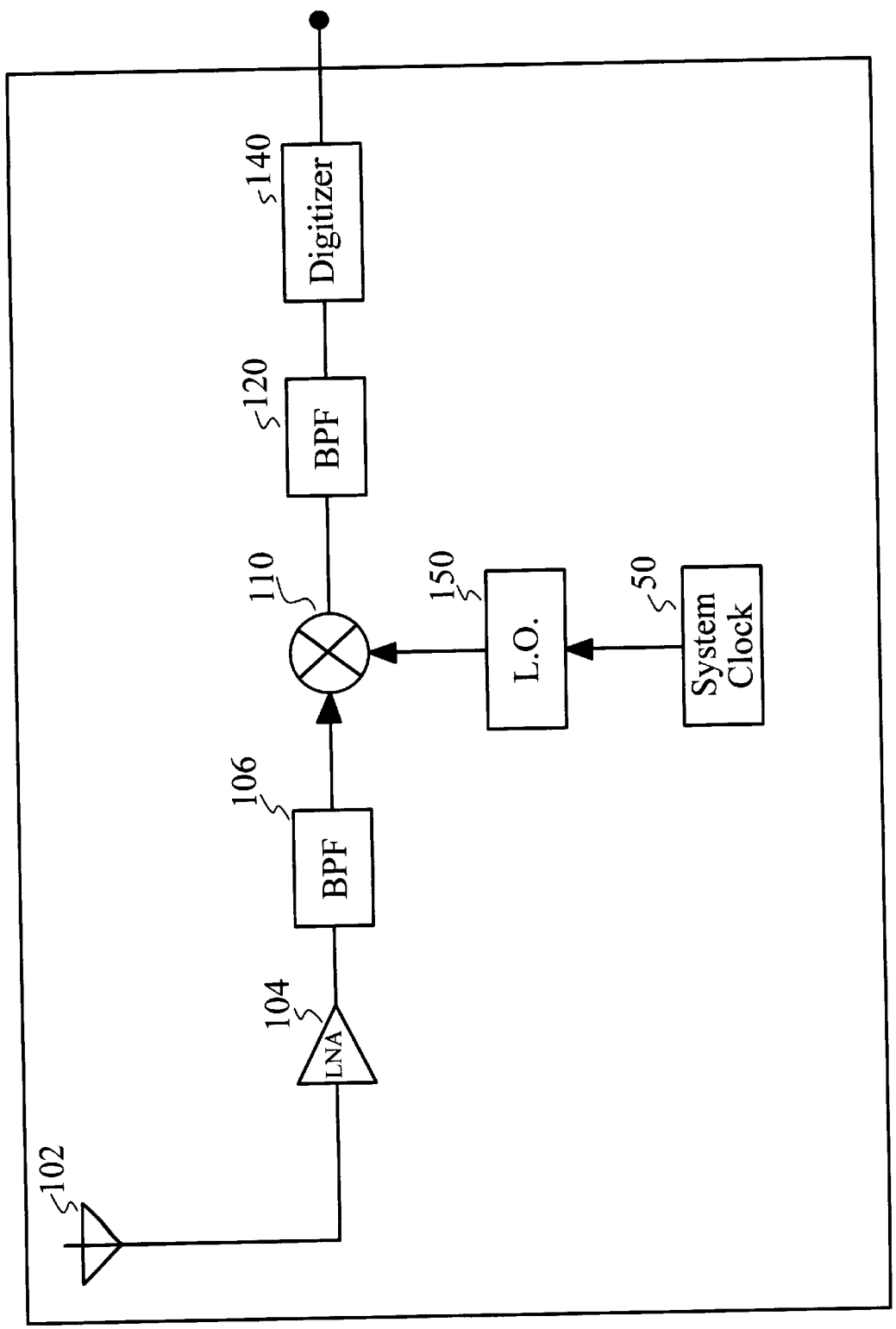
FIG. 2 is a block diagram of an MSK RF subsystem.

FIG. 2 illustrates a typical MSK RF subsystem 100 capable of producing an MSK input signal suitable for the processing apparatus and method disclosed herein. Antenna 102 receives the transmitted MSK signal which is passed through a low noise amplifier 104 and bandpass filter 106. A mixer 110 multiplies the received MSK signal with a local oscillator (LO) frequency generated by local oscillator 150 to produce an intermediate frequency (IF). The intermediate frequency signal is passed through IF bandpass filter 120 and input to digitizer 140. Preferably, filter 120 is an adjustable bandwidth filter. The bandwidth is selected according to the data bit rate of the MSK signal. Preferably, the center frequency of the signal output by mixer 110 is about 4.88 kHz. Digitizer 140 comprises means for sampling the signal output from filter 120 and quantizing it to an appropriate number of bits. Digitizer 140 comprises a hard-limiter and one bit quantizer.

One bit quantization eliminates the need for a sophisticated automatic gain control system to accommodate the large dynamic range of an incoming MSK signal received from a transmitter. Further, finer quantization increases the complexity and cost of digitally demodulating the signal. However, the coarser the quantization, the greater must be the signal to noise ratio at the input of a digitizer in order to recover the desired signal. Therefore, coarse quantization requires high quality filtering before digitizing. The down-conversion provided by mixer 110 makes high quality filtering more easy to achieve. Alternative embodiments of MSK signal converter 100 could include finer quantization and lower quality filtering, or indeed no filtering at all. The bandwidth of filter 120 is preferably adjustable to be equal to 1.2 times the MSK data bit rate, which yields about 99% power containment. Filter 120 could comprise an RC network and CMOS switching circuitry. An alternative embodiment could employ a switched capacitor filter.

Mixer 110 could be a common analog multiplier, although other common implementations would be recognized by those skilled in the art. Local oscillator 150 should comprise a direct digital synthesizer, DDS, for generating a smooth analog sine wave to avoid generation of harmonics in the mixing process. The DDS is driven by a system clock 50. System clock 50, is preferably a temperature compensated crystal oscillator, TCXO. Provision of a local oscillator can be accomplished in a variety of ways readily recognizable to those skilled in this art. However, mixing the MSK signal with a local oscillator prior to input to complex mixer 200 is not strictly necessary as long as the reference carrier generated by reference carrier generator 220 can be made equal to the center frequency of the MSK input signal.

Referring to FIG. 1, the MSK input signal is input to complex mixer 200, wherein it is complex-mixed with a reference carrier generated by reference carrier generator 220 to produce a signal in phase with the reference carrier, the I signal, and a signal in quadrature phase with the reference carrier, the Q signal. In a preferred embodiment, the reference carrier generator is a digitally controlled oscillator, DCO, driven by system clock 50. The reference carrier produced by the DCO is a sine wave quantized to two bits. Finer quantization could be accomplished at the expense of greater system cost and complexity. Complex mixer 200 is comprised of two mixers 210 and 230. The reference carrier from reference carrier generator 220 is fed directly into mixer 210, but is phased shifted by about 90 degrees before being input to mixer 230. This phase shift of the reference carrier is generated by reference carrier generator 220. The frequency of the reference carrier is about equal to the center frequency of the MSK input signal received by complex mixer 200, so that both I and Q signals output from complex mixer 200 are at baseband.

In an alternative embodiment, an RF subsystem would comprise a complex mixer for providing in phase and in quadrature MSK signals at an intermediate frequency. The in phase IF signal would be input to mixer 210 and the quadrature IF signal would be input to mixer 230. The phase shift of the reference carrier before input to mixer 230 would be set to zero. This alternative configuration produces I and Q signals output from complex mixer 200 at baseband.

Although, complex mixer 200 is represented herein functionally as multipliers and a DCO, a person skilled in the art would recognize that a variety of implementations will achieve the same result of producing an in phase signal and an in quadrature signal. Alternative ways of generating a reference carrier, such as a voltage controlled oscillator, would readily be recognized by persons of ordinary skill in the art. Also, the phase shift of the reference carrier can be generated by phase shifter circuitry or any other means for phase shifting a signal, and such means would be readily recognizable by persons skilled in the art. Mixers 210 and 230 employ common logic circuitry for effecting the multiplication of the reference carrier and the MSK input signal.

Referring to FIG. 1, the I and Q signals from complex mixer 200 are input into the I and Q signal accumulators 280 and 290, respectively, which accumulate the signals over an interval of time. The accumulation interval is such that an even integer multiple of the accumulation interval is equal to an MSK data bit interval. The start and end of the accumulation intervals of the I and Q signal accumulators is controlled by an end accumulate clock generated by MSK data clock generator 300. The accumulation intervals are synchronized with the data bit intervals of the MSK signal by data clock synchronizer 500, such that the start of a data bit interval coincides with the start of an accumulation interval and the end of an accumulation interval coincides with the end of a data bit interval. At the end of each accumulation interval the accumulation is output from the I and Q accumulators 280 and 290 for further processing. The I and Q signal accumulators 280 and 290 are implemented in hardware as digital accumulators.

Figure 3:
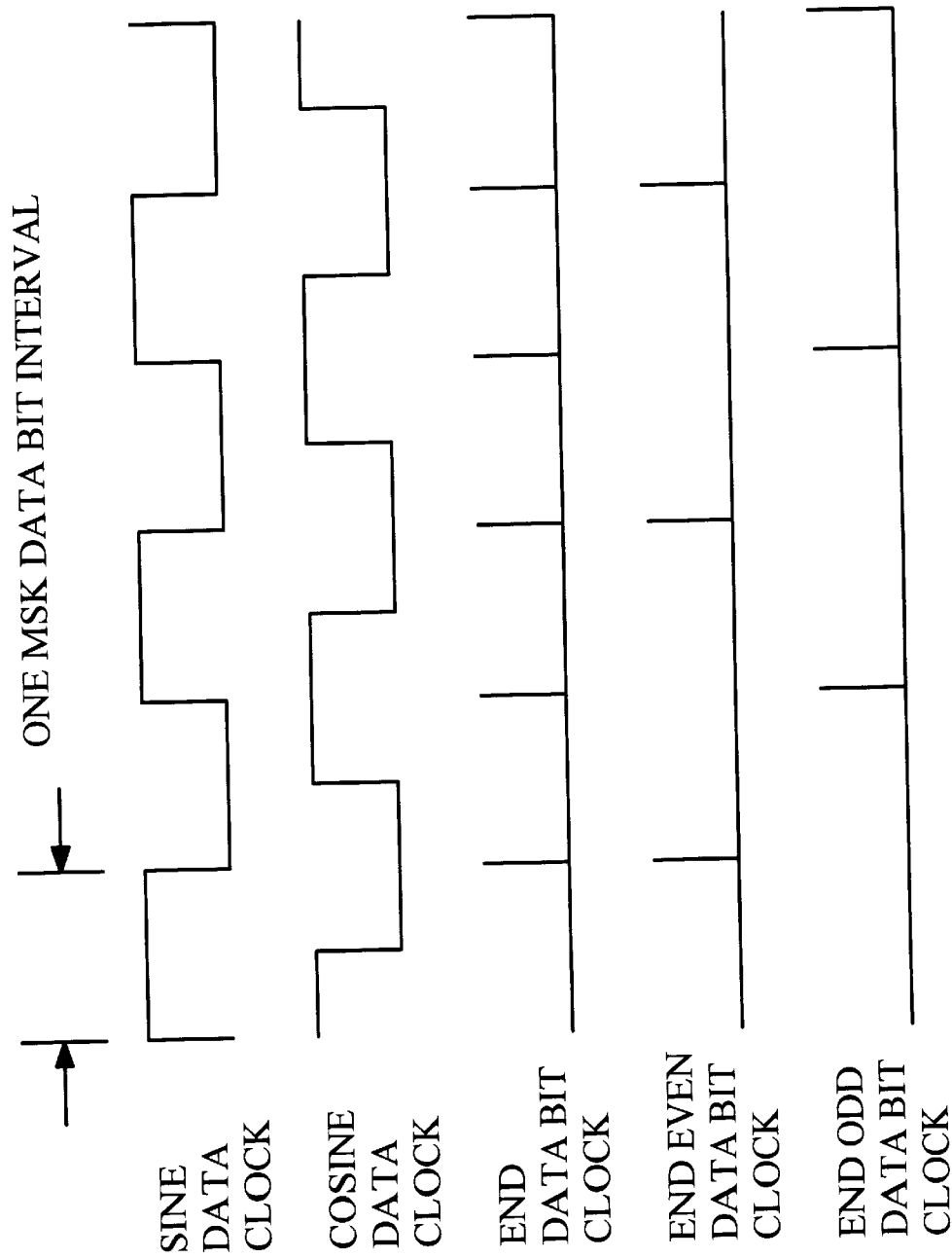
FIG. 3 is a diagram of MSK data clocks.

Referring to FIG. 3, MSK data clock generator 300 generates MSK data clocks which comprise a sine data clock and a cosine data clock. The period of the sine and cosine data clocks is two MSK data bit intervals. When data clock synchronization is achieved, the sine data clock alternates sign at the start of each data bit interval. The cosine data clock alternates sign one half data bit interval after the sign data clock changes sign. The MSK data clocks further comprise an end accumulate clock for controlling the accumulation intervals of the I and Q signal accumulators 280 and 290. The MSK data clocks further comprise an end data bit clock used by carrier synchronizer 400 and data clock synchronizer 500 as described below. The MSK data clocks may also comprise an end odd data bit clock and an end even data bit clock for differential decoding of the MSK data, as discussed below. In a preferred embodiment, MSK data clock generator 300 comprises a digitally controlled oscillator (DCO) driven by system clock 50. However, MSK data clock generator 300 could alternatively be implemented as a voltage controlled oscillator or by other hardware configurations known to those with skill in the art. Further, MSK data clock generator 300 could be implemented in a processor under the direction of software instructions which could readily be developed by a person with ordinary skill in the art given the requirements set forth herein. To achieve both carrier and data clock synchronization, the I and Q signals are further resolved into components in phase and in quadrature phase with the sine data clock. This may be accomplished as follows.

Figure 4:
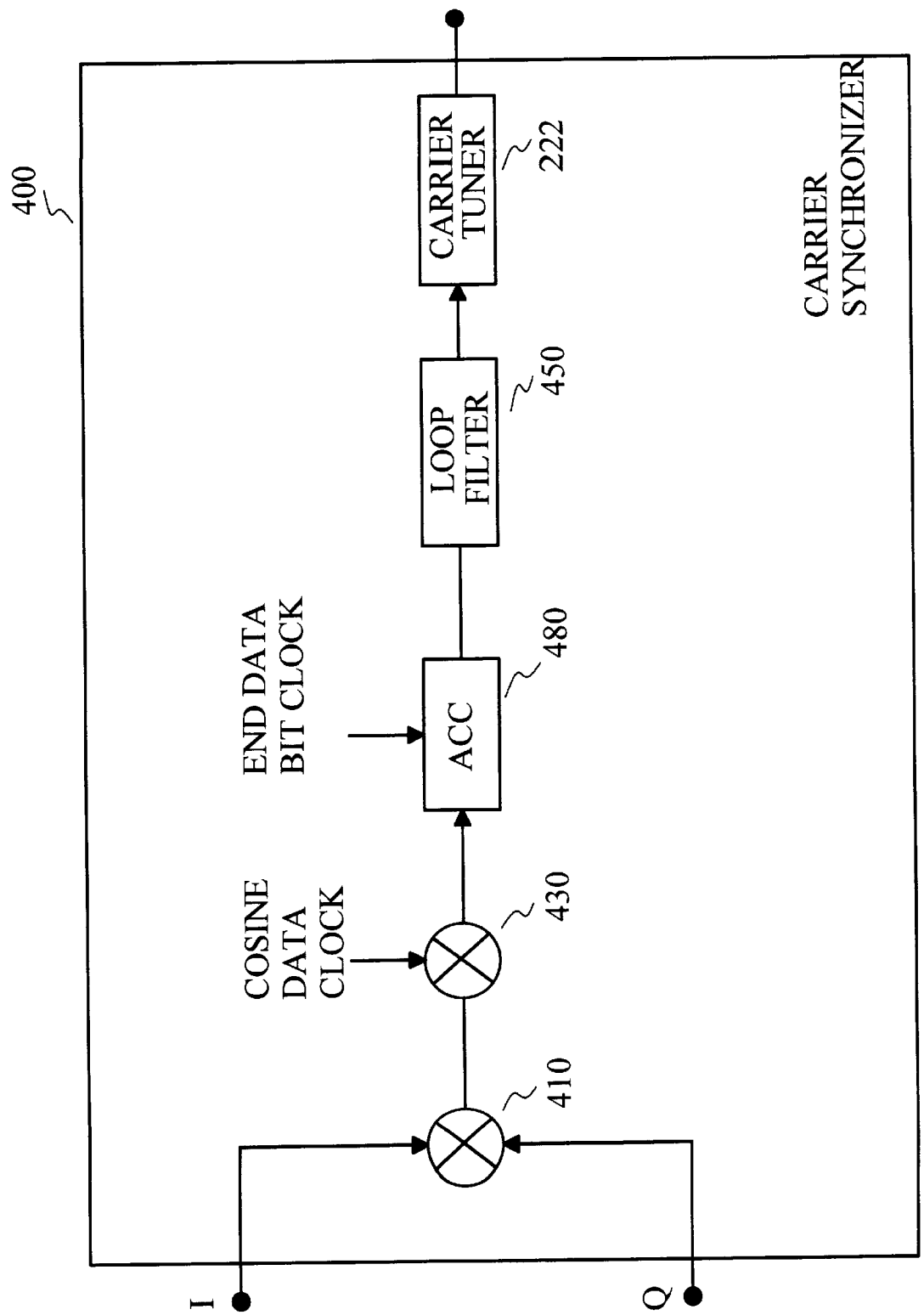
FIG. 4 is a block diagram of a preferred embodiment of a carrier synchronizer.

Referring to FIG. 4, carrier synchronizer 400 is comprised of a mixer 410 for multiplying the accumulated I and Q signals from I and Q signal accumulators 280 and 290. The output of mixer 410 is input to mixer 430, where it is multiplied with the cosine data clock from MSK data clock generator 300. Because the data bit interval is an even integer multiple of the accumulation interval of accumulators 280 and 290, the transition of the cosine data clock will coincide with the start and end of an accumulation interval of accumulators 280 and 290. The output of mixer 430 is accumulated by accumulator 480 over the interval of one data bit to produce a carrier clock error signal. The accumulation interval of accumulator 480 is controlled by the end data bit clock from MSK data clock generator 300. The accumulation interval of accumulator 480 is synchronized with the data bit intervals of the MSK signal by data clock synchronizer 500, such that the start and end of the data bit interval coincides with the start and end of an accumulation interval. In an alternative embodiment, accumulator 480 can be synchronized to accumulate over an integer multiple of one whole data bit interval. However, the functional equivalent to longer accumulations is accomplished by loop filter 450. The carrier clock error signal is filtered by carrier loop filter 450. The output of carrier loop filter 450 is input to carrier tuner 222, which controls the output of reference carrier generator 220.

The elements comprising carrier synchronizer 400 form a phase locked loop which drives the difference in phase and frequency between the reference carrier and the center frequency of the MSK input signal to zero. When this occurs the reference carrier is synchronized with the center frequency of the MSK input signal, thus reconstructing the suppressed carrier of the MSK signal.

Figure 5:
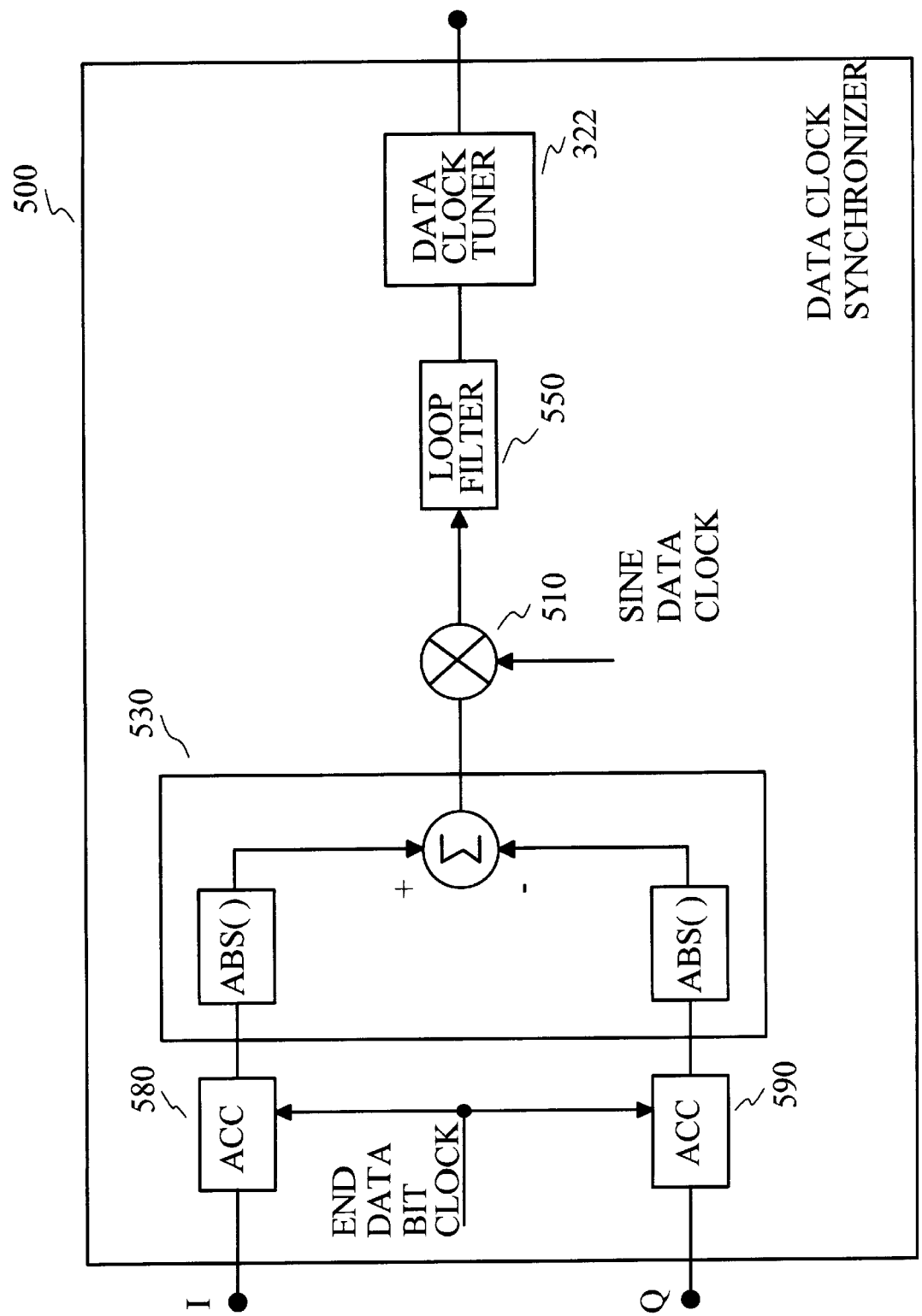
FIG. 5 is a block diagram of a preferred embodiment of a data clock synchronizer.

Referring to FIG. 5, data clock synchronizer 500 comprises two accumulators 580 and 590 which separately accumulate over one data bit interval the accumulated I and Q signals received from I and Q signal accumulators 280 and 290. The accumulation interval of accumulators 580 and 590 is controlled by the end data bit clock generated by MSK data clock 300. The accumulation interval of accumulators 580 and 590 is such that when data clock synchronization is achieved, the start and end of the accumulation interval coincides with the start and end of a data bit interval. Subtractor 530 computes the difference between the absolute values of the outputs of accumulators 580 and 590. A nearly equivalent signal may be generated by computing the difference of the square of the outputs of accumulators 580 and 590. The output of subtractor 530 is multiplied in mixer 510 with the data sine clock from MSK data clock 300 to produce a data clock error signal. The data clock error signal is filtered by a data clock loop filter 550 and is then input into an MSK data clock tuner 322 which controls the output of MSK data clock generator 300.

The components comprising data clock synchronizer 500 form a phase locked loop which drives the difference in phase and frequency between the MSK data clocks and the MSK data stream to zero. When this occurs the MSK data clocks are synchronized with the incoming MSK data stream. This simultaneously synchronizes all of the accumulators of system 10. Synchronous accumulation reduces noise and intersymbol interference without imposing narrow bandwidth constraints on the phase error detection loops of carrier synchronizer 400 and data clock synchronizer 500. This enhances the capability to rapidly acquire and achieve phase lock in these two loops.

Any of the elements comprising carrier synchronizer 400 and/or data clock synchronizer 500 can be implemented in hardware in a variety of ways readily recognizable by persons with ordinary skill in the art. However, carrier synchronizer 400 and data clock synchronizer 500 comprise a processor under the direction of software instructions. A set of software instructions sufficient to cause a processor to accomplish the functions of carrier synchronizer 400 and data clock synchronizer 500 could readily be developed by a person of ordinary skill in the art given the requirements specified herein. In particular, loop filters 450 and 550 are digital filters that may be optimized for the particular implementation of the system and methods described herein by appropriate selection of the filter coefficients. Although formulas may aid in deriving these coefficients, the preferred means is to obtain them experimentally by software simulation. Simulation software for simulation of system 10 with appropriate inputs to simulate the processing of an MSK signal is executed by a programmable computer. By an iterative process the loop filter coefficients of loop filters 450 and 550 may be developed for suitable or optimal system operation. A person of ordinary skill in the art could readily develop such simulation software given the requirements set forth herein. Also, the software listing of FIGS. 8a and 8b, discussed below, may be adapted for this purpose.

When the data clock is synchronized, the data bit intervals of the incoming MSK data stream coincide with accumulation intervals of I and Q signal accumulators 280 and 290. More precisely, each data bit interval is an even integer multiple of the accumulation interval of accumulators 280 and 290 and the start of an incoming data bit coincides with the start of an accumulation interval. When the reference carrier is synchronized, the I and Q signals are at baseband. Consequently, the phase of these signals will advance or retard over a one data bit interval by 90 degrees beginning and ending at one of the cardinal phase angles, 0, 90, 180 and 270 degrees. Since an MSK signal is phase continuous, the signal will maintain the same sign over a duration of at least two successive data bits. Since the I and Q signals are 90 degrees out of phase, two-bit intervals of constant sign will be staggered in time by one data bit interval between the I and Q signals. Thus, to recover the data from the I and Q signals, the I and Q signals can be separately accumulated over two-bit intervals. The two-bit I signal accumulation is staggered by one bit interval from the two-bit Q signal accumulation. The results of these accumulations are then recombined to recover the data. This method of accumulating over two-bit data intervals improves system sensitivity by 3 dB.

Figure 6:
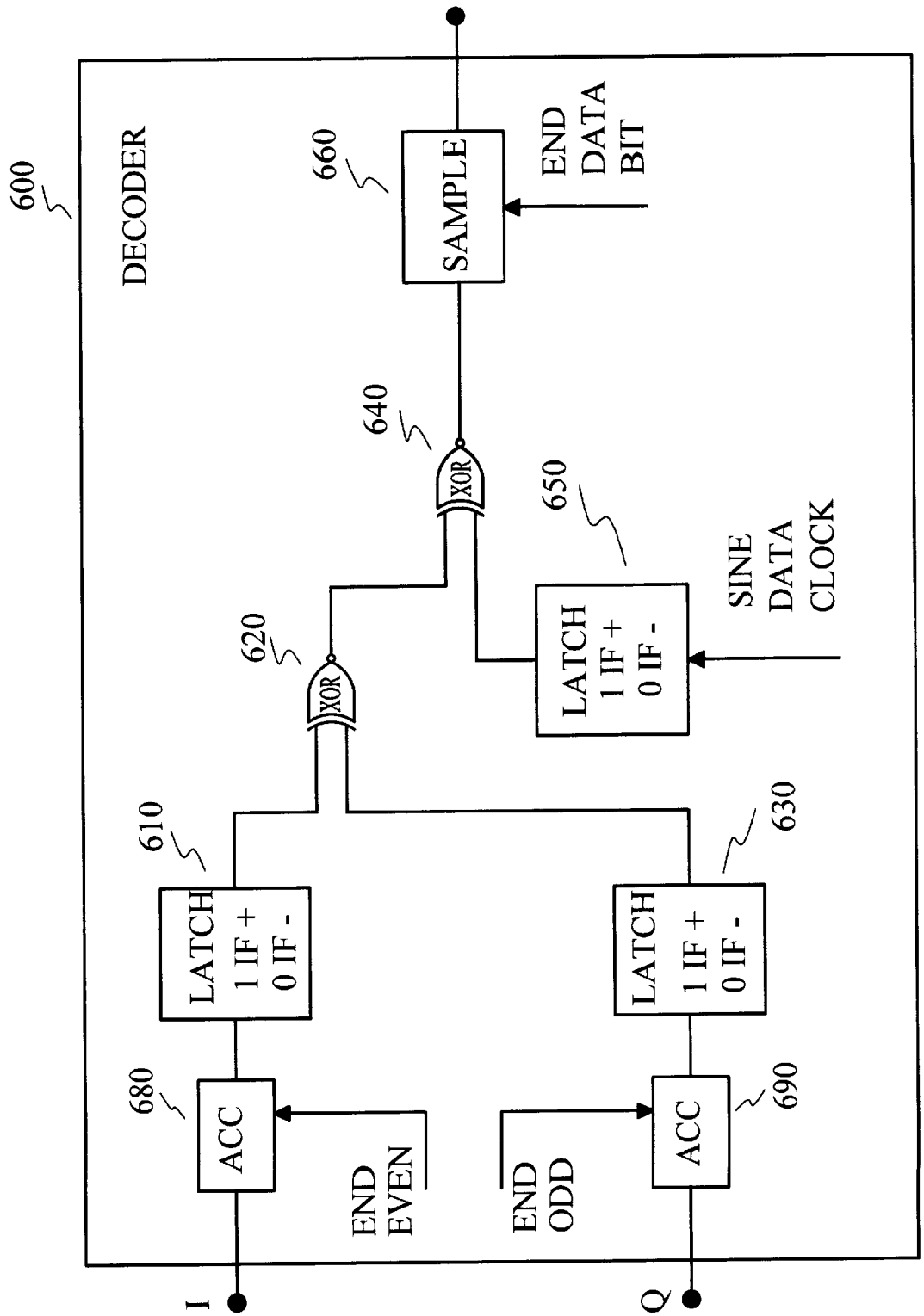
FIG. 6 is a block diagram of a preferred embodiment of a decoder.

Referring to FIG. 6, in one embodiment, a decoder 600 comprises accumulators 680 and 690 for further accumulating signals received from I and Q signal accumulators 280 and 290. In this embodiment, the end odd data bit clock generated by MSK data clock generator 300 controls the accumulation interval of accumulator 690. The end even data bit clock generated by MSK data clock generator 300 controls the accumulation interval of accumulator 680. In this way, the two-bit accumulation intervals of accumulators 680 and 690 are staggered by one data bit interval. The accumulation intervals of accumulators 680 and 690 are synchronized with the data bit intervals of the MSK signal by data clock synchronizer 500, such that the start of an accumulation interval coincides with the start of a data bit interval and ends after two data bit intervals. The outputs of these accumulations are latched by latches 610 and 630. The latched accumulations are input to a first exclusive OR (XOR) gate 620. Also, the data sine clock from MSK data clock generator 300 is quantized by a quantizer 650. The quantized sine data clock from quantizer 650 is XOR-ed with the output of the first XOR gate 620 by a second XOR gate 640. Latches 610 and 630 and quantizer 650 cause the signals input to XOR gates 620 and 640 to be at the appropriate logic levels. The output of XOR gate 640 is sampled every data bit by a sampler 660 to produce a decoded MSK data bit stream.

The elements comprising decoder 600 can be implemented in hardware in a variety of ways readily recognizable by persons with ordinary skill in the art. Preferably, however, decoder 600 comprises a processor under the direction of software instructions. A set of software instructions sufficient to cause a processor to accomplish the functions of decoder 600 could readily be developed by a person of ordinary skill in the art given the requirements specified herein. Moreover, other decoding methods known to persons of skill in the art could be used to decode the outputs from I and Q signal accumulators 280 and 290.

Carrier reference generator 220 may be tuned by carrier tuner 222, enabling carrier reference generator 220 to be tuned to a frequency about equal to the center frequency of the MSK input signal. This enables MSK signal processor system 10 to process MSK signals transmitted at different frequencies. The elements comprising carrier tuner 222 can be implemented in hardware in a variety of ways readily recognizable by persons with ordinary skill in the art. However, carrier tuner 222 comprises a processor under the direction of software instructions. A set of software instructions sufficient to cause a processor to accomplish the functions of carrier tuner 222 could readily be developed by a person of ordinary skill in the art given the requirements specified herein.

MSK data clock generator 300 may be tuned by data clock tuner 322, enabling MSK data clock generator 300 to be tuned to about the data bit rate of the MSK signal. This enables MSK signal processor system 10 to process MSK signals transmitted at different data bit rates. The elements comprising data clock tuner 322 can be implemented in hardware in a variety of ways readily recognizable by persons with ordinary skill in the art. Preferably, however, data clock tuner 322 comprises a processor under the direction of software instructions. A set of software instructions sufficient to cause a processor to accomplish the functions of data clock tuner 322 could readily be developed by a person of ordinary skill in the art given the requirements specified herein.

Finally, a single processor operating under the direction of software instructions would comprise carrier synchronizer 400, data clock synchronizer 500 and decoder 600.

Figure 7:
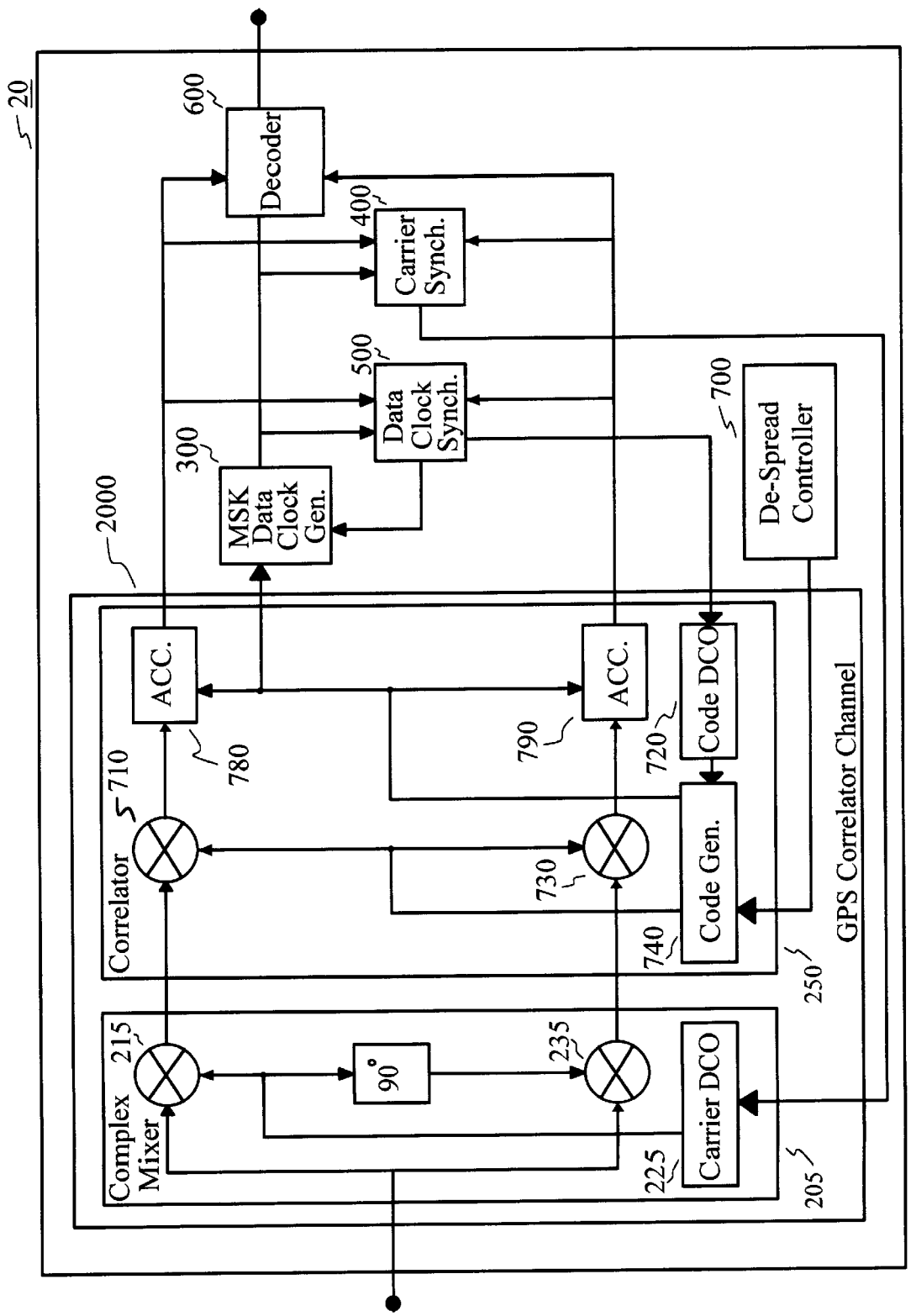
FIG. 7 is a block diagram of a preferred embodiment of an MSK signal processor using a GPS correlator channel.

Preferably, the methods and apparatus for processing an MSK signal as described above are adapted for use with a GPS correlator channel. Referring to FIG. 7, the preferred embodiment depicted as system 20 comprises a GPS correlator channel 2000, MSK data clock generator 300, carrier synchronizer 400, data clock synchronizer 500, and de-spread controller 700. Comparison of FIGS. 1 and 7 reveals that complex mixer 200 and I and Q signal accumulators 280 and 290 are replaced by GPS correlator channel 2000. Also note that the output of data clock synchronizer 500 is input to the code DCO 720 of GPS correlator channel 2000. Further note that an end-of-epoch timing signal from code generator 740 is received by MSK data clock generator 300. Finally, note the introduction of de-spread controller 700 for disabling the de-spreading process in GPS correlator channel 2000. These adaptations enable a GPS correlator channel to be used for processing an MSK signal as will now be described.

Referring to FIG. 7, an MSK input signal is received by GPS correlator channel 2000. The MSK input signal is mixed with a reference carrier generated by carrier DCO 225 in complex mixer 205 of GPS correlator channel 2000. The reference carrier is synchronized with the center frequency of the MSK input signal by carrier synchronizer 400. The output of complex mixer 205 is two signals that are input to correlator 250 of GPS correlator channel 2000. Correlator 250 outputs I and Q signals for further processing.

In this embodiment, MSK RF subsystem 100 receives an MSK signal and converts it to an MSK input signal to be received by GPS correlator channel 2000. The embodiment of MSK RF subsystem 100 described above is suitable for use with a GPS correlator channel as long as the quantization provided by digitizer 140 is compatible with the input requirements of a GPS correlator channel. Most GPS correlator channels are designed to process signals quantized to 1, 2 or 3 bits. A preferred embodiment of system 20 comprises a GEC Plessey 2021 12 channel GPS correlator, which can process signals quantized to one or two bits, thereby enabling digitizer 140 to perform one bit quantization.

Also note that in the preferred embodiment of system 20, system clock 50 is the GPS receiver reference oscillator. It is not necessary or preferred to provide a separate reference oscillator for driving local oscillator 150 and MSK data clock generator 300. Moreover, it is not strictly necessary to down convert the MSK signal prior to input to GPS correlator channel 2000 as long as carrier DCO 225 can be tuned to the center frequency of the MSK input signal. Whether or not MSK RF subsystem 100 comprises mixing, the center frequency of the MSK input signal must be within the tunable range of carrier DCO 225 of GPS correlator channel 2000.

Referring to FIG. 7, an MSK input signal is input to GPS correlator channel 2000. GPS correlator channel 2000 comprises complex mixer 205 and correlator 250. Complex mixer 205 further comprises carrier DCO 225, and mixers 215 and 235. Correlator 250 is represented schematically in FIG. 7 as comprising code generator 740, code DCO 720, code mixers 710 and 730, and accumulators 780 and 790. The schematic representation of GPS correlator channel 2000 in FIG. 7 is a simplification of the actual configuration found in most GPS correlator channels. Nevertheless, the representation of FIG. 7 is functionally adequate to enable persons of ordinary skill in the art to practice the invention described herein and is further adequate for disclosing the best mode known to the inventors for practicing the invention claimed herein. Alternative embodiments of GPS correlator channels exist, comprising means for complex mixing a signal with a reference carrier, a means for mixing a signal with a PRN code generated by a code generator under control of a code DCO, and means for accumulation over an epoch of the PRN code. The principles, methods, and apparatus described herein can readily be adapted to alternative GPS correlator channel embodiments.

Complex mixer 205 of GPS correlator channel 2000 mixes the MSK input signal with a reference carrier generated by carrier DCO 225 to produce a signal in phase with the reference carrier, the I signal, and a signal in quadrature phase with the reference carrier, the Q signal. Carrier DCO 225 is tuned by carrier tuner 222 to be about equal to the center frequency of the MSK input signal so that both I and Q signals output from complex mixer 205 are at baseband. This enables the GPS correlator channel to be used to process MSK signals transmitted at different frequencies. The elements comprising carrier tuner 222 can be implemented in hardware in a variety of ways readily recognizable by persons with ordinary skill in the art. However, carrier tuner 222 comprises a processor under the direction of software instructions. A set of software instructions sufficient to cause a processor to accomplish the functions of carrier tuner 222 could readily be developed by a person of ordinary skill in the art given the requirements specified herein.

In an alternative embodiment, an RF subsystem would comprise a complex mixer for providing in phase and in quadrature MSK signals at an intermediate frequency. The in phase IF signal would be input to mixer 215 and the quadrature IF signal would be input to mixer 235. The phase shift of the reference carrier before input to mixer 235 would be set to zero. This alternative configuration produces I and Q signals output from complex mixer 205 at baseband.

The I and Q signals from complex mixer 205 are input to correlator 250. De-spread controller 700 disables the de-spreading process by disabling the application of the PRN code from code generator 740. Commercially available receiver components, such as the GEC Plessey GP2021 used in conjunction with the GP2010 provides this means for disabling the de-spreading process. Specifically, for the GP2010, application of the de-spreading code is disabled by means of the control bit "CODE_OFF/ONB" in the CHx_SATCTL registers. This method of disabling the de-spreading process allows any one or more channels of a multi-channel GPS receiver to be selected for MSK signal processing.

In a preferred embodiment, de-spread controller 700 comprises a processor operating under the direction of software instructions. A set of software instructions sufficient to cause the processor to perform the functions ascribed herein to de-spread controller 700 can readily be developed by persons of ordinary skill in the art.

An alternative means for disabling the de-spreading process is to cause the code generator to output a sequence that is constant over the duration of each epoch. Standard C/A code generators in GPS correlator channels output a 1023 bit code sequence which itself is the Modulo-2 sum of two 1023 bit sequences. The two sequences are generated by 10-stage shift registers, which are initialized by two 10 bit input vectors. It is possible in some correlator devices to initialize these registers to produce a sequence of 1023 bits all equal to a constant. This method of de-spread disablement, however, requires external access to the initialization registers, which may not be provided by commercially available components.

Another means for disabling the de-spreading process is to adapt the manufacture of multi-channel GPS receivers to provide one or more non-de-spreading channels. Simple modifications to the existing hardware configuration of a channel can be made to disable spreading. For example, a channel can be configured with the code generator disabled or with code mixers hardwired to a constant voltage rather than to the code generator. A disadvantage of manufacturing hardwired non-de-spreading channels in a multi-channel GPS receiver is that the number of channels available for MSK signal processing is fixed rather than variable.

An alternative to disabling the de-spreading process in the GPS correlator channel is to spread the received MSK signal with a PRN code before it is input to the channel. The de-spreading process in the channel would then remove the PRN code from the MSK signal. The PRN code to be impressed on the received MSK signal may be obtained from a GPS correlator channel if external access to the code generated by the code generator is provided. Alternatively, the received MSK signal could be impressed by a PRN code generated by an external code generator and code DCO. Applying a spreading code to the MSK signal before it enters the correlator channel has an advantage in that MSK signals thus encoded can be combined with signals from GPS satellites and conveyed to the multichannel correlator device as a single input signal. This would be very useful in situations where the GPS correlator device does not provide for multiple input sources.

Any of the above-described methods may be employed to cause a GPS correlator channel to output I and Q signals that are uncorrupted by a PRN code. However, as previously noted, the preferred means is to selectively disable application of the de-spreading code. Thus, in a preferred embodiment the I and Q signals from complex mixer 205 are output from code mixers 710 and 730 uncorrupted by a PRN code. The output of mixers 710 and 730 are received by accumulators 780 and 790, which correspond functionally to I and Q signal accumulators 280 and 290 of system 10. Accumulators 780 and 790 accumulate the outputs of code mixers 710 and 730 over an interval equal to one epoch and then dump the result at the end of each epoch. These outputs are received from GPS correlator channel 2000 for further processing.

In a preferred embodiment for using a GPS correlator channel for MSK signal processing, MSK data clock generator 300 receives an end-of-epoch timing signal from GPS correlator channel 2000. The MSK data clocks are generated from an even integer multiple of epochs equal to one data bit interval. When data clock synchronization is achieved, the timing of the MSK data clocks with respect to a data bit interval is as previously described and as shown in FIG. 3. Note, however, that when a GPS receiver is used to process MSK signals it is not necessary to generate an end accumulate clock. Since the MSK data clocks are generated from an integer multiple of an epoch, synchronization of the MSK data clocks with the MSK data bit intervals will cause the epochs to also be synchronized with the data bit intervals. Code DCO 720 may be tuned by data clock tuner 322, causing MSK data clock generator 300 to be tuned to about the data bit rate of the MSK signal. This enables MSK signal processor system 20 to process MSK signals transmitted at different data bit rates. The elements comprising data clock tuner 322 can be implemented in hardware in a variety of ways readily recognizable by persons with ordinary skill in the art. However, data clock tuner 322 comprises a processor under the direction of software instructions. A set of software instructions sufficient to cause a processor to accomplish the functions of data clock tuner 322 could readily be developed by a person of ordinary skill in the art given the requirements specified herein.

In a preferred embodiment for processing MSK signals with a GPS correlator channel, MSK data clock generator 300 comprises a processor operating under the direction of software instructions. A set of software instructions sufficient to cause a processor to accomplish the functions of MSK data clock generator 300 could readily be developed by a person of ordinary skill in the art given the requirements specified herein.

Referring to FIG. 4, the I and Q signals from accumulators 780 and 790 are input to mixer 410 of carrier synchronizer 400. The output of mixer 410 is input to mixer 430, where it is multiplied by the cosine data clock. For the cosine data clock transition to coincide with the start an end of an accumulation interval of accumulators 780 and 790, the duration of an epoch must be such that a data bit interval is an even integer multiple of an epoch. MSK signals in differential GPS applications are transmitted at rates of 25, 50, 100 and 200 bits per second corresponding to data bit intervals of 40, 20, 10 and 5 milliseconds, respectively. The epoch of a C/A code used in DGPS is nominally one millisecond. Thus, the 200 bps transmission rate does not produce a data bit interval that is an even integer multiple of the nominal 1 millisecond epoch. Therefore, the epoch must be increased or decreased from the nominal value to achieve synchronization with a 200 bps MSK signal. The code DCO of a GPS correlator channel is designed to vary the epoch duration to achieve synchronization between the C/A code and the code impressed on a GPS satellite signal. The code DCO can therefore be used to generate a larger or shorter epoch for 200 bps MSK signal synchronization. In a preferred embodiment, the epoch for 200 bps MSK signal processing is chosen to be 1.25 milliseconds corresponding to 4 epochs per data bit interval. In the GEC Plessey GP2021, this epoch duration can be achieved without causing the accumulation registers to overflow. In an alternative embodiment, the epoch can be made less than 1 millisecond corresponding to an even number of accumulations per data bit interval.

The output of mixer 430 is accumulated by accumulator 480 over the interval of one data bit, to produce a carrier phase error signal. The accumulation interval of accumulator 480 is controlled by the end data bit clock generated by MSK data clock generator 300. The accumulation interval of accumulator 480 is synchronized with the data bit intervals of the MSK signal by data clock synchronizer 500, such that the start and end of the accumulation interval coincides with the start and end of a data bit interval. In an alternative embodiment, accumulator 480 can be synchronized to accumulate over an integer multiple of one whole data bit interval. However, the functional equivalent to longer accumulations is accomplished by loop filter 450. The carrier phase error signal is filtered by loop filter 450 and is input to carrier tuner 222, which controls the output of carrier DCO 225. This places carrier DCO 225 in a phase locked loop which drives the difference in phase and frequency between the reference carrier and the center frequency of the MSK input signal to zero. When this occurs, the reference carrier is synchronized with the center frequency of the MSK input signal.

Referring to FIG. 5, in a preferred embodiment using a GPS correlator channel to process MSK signals, data clock synchronizer 500 operates as described above, except that accumulators 580 and 590 receive the I and Q signals from accumulators 780 and 790 of GPS correlator channel 2000, and the output of data clock tuner 322 is input to code DCO 720 of GPS correlator channel 2000. This places code DCO 720 in a phase locked loop which controls the epoch repetition rate so as to drive the difference in phase and frequency between the MSK data clocks and the MSK data bit stream to zero. When this occurs, the MSK data clocks and the epochs are synchronized with the MSK data stream. This simultaneously synchronizes all of the accumulators of system 20. Synchronous accumulation reduces noise and intersymbol interference without imposing narrow bandwidth constraints on the phase error detection loops of carrier synchronizer 400 and data clock synchronizer 500. This enhances the capability to rapidly acquire and maintain phase lock in these two loops.

Any of the elements comprising carrier synchronizer 400 and/or data clock synchronizer 500 can be implemented in hardware in a variety of ways readily recognizable by persons with ordinary skill in the art. Preferably, however, carrier synchronizer 400 and data clock synchronizer 500 comprise a processor under the direction of software instructions. A set of software instructions sufficient to cause a processor to accomplish the functions of carrier synchronizer 400 and data clock synchronizer 500 could readily be developed by a person of ordinary skill in the art given the requirements specified herein. In particular, loop filters 450 and 550 are digital filters that may be optimized for the particular implementation of the system and methods described herein by appropriate selection of the filter coefficients. Although formulas may aid in deriving these coefficients, the preferred means is to obtain them experimentally by software simulation. Simulation software for simulation of system 20 with appropriate inputs to simulate the processing of an MSK signal is executed by a programmable computer. By an iterative process the loop filter coefficients of loop filters 450 and 550 may be developed for suitable or optimal system operation. A person of ordinary skill in the art could readily develop such simulation software given the requirements set forth herein. A simulation software listing for development of coefficients for loop filters 450 and 550 is provided in FIGS. 8a and 8b.

When the MSK data clocks are synchronized, the accumulation intervals of accumulators 780 and 790 coincide with the data bit intervals of the incoming MSK data stream. More precisely, each data bit interval is an even integer multiple of the accumulation interval of accumulators 780 and 790 and the start of an incoming data bit coincides with the start of an accumulation interval of accumulators 780 and 790. When the reference carrier is synchronized, the I and Q signals are at baseband. Consequently, the phase of these signals will advance or retard over a one data bit interval by 90 degrees, beginning and ending at one of the cardinal phase angles, 0, 90, 180 and 270 degrees. Since an MSK signal is phase continuous, the signal will maintain the same sign over a duration of at least two successive data bits. Since the I and Q signals are 90 degrees out of phase, two-bit intervals of constant sign will be staggered in time by one data bit interval between the I and Q signals. Thus, to recover the data from the I and Q signals, the I and Q signals can be separately accumulated over two-bit intervals. The two-bit I signal accumulation is staggered by one bit interval from the two-bit Q signal accumulation. The results of these accumulations are then recombined to recover the data. This method of accumulating over two-bit data intervals improves system sensitivity by 3 dB.

Referring to FIG. 6, in a preferred embodiment for processing an MSK signal with a GPS correlator channel, decoder 600 operates and is implemented as described above, except that accumulators 680 and 690 receive the I and Q signals from accumulators 780 and 790 of GPS correlator channel 2000.

The elements comprising decoder 600 can be implemented in hardware in a variety of ways readily recognizable by persons with ordinary skill in the art. Preferably, however, decoder 600 comprises a processor under the direction of software instructions. A set of software instructions sufficient to cause a processor to accomplish the functions of decoder 600 could readily be developed by a person of ordinary skill in the art given the requirements specified herein. Moreover, other decoding methods known to persons of skill in the art could be used to decode the outputs from accumulators 780 and 790.

Finally, MSK data clock generator 300, carrier synchronizer 400, data clock synchronizer 500, decoder 600, and de-spread controller 700 would be implemented in a GPS receiver signal processor. The GPS receiver signal processor can also be configured by software to control the selection of one or more channels of a multi-channel GPS receiver for processing MSK signals.

Clearly, changes can be made in the above-described details without departing from the underlying principles of the present invention. A description of a particular embodiment does not determine the scope of an invention. Rather, the scope of the present invention is determined by the following claims.

What is claimed is:

1. A system for processing an MSK signal comprising:
   an MSK data clock generator for generating MSK data clocks;
   a complex mixer for mixing an MSK input signal with a reference carrier to produce signals in phase and in quadrature with the reference carrier; the complex mixer further comprising a reference carrier generator for generating the reference carrier;
   an I signal accumulator for accumulating the in phase signal received from the complex mixer and a Q signal accumulator for accumulating the in-quadrature signal received from the complex mixer;
   a carrier synchronizer for generating a carrier clock error signal for synchronizing the reference carrier with the center frequency of the MSK input signal; and
   a data clock synchronizer for generating a data clock error signal for synchronizing the MSK data clocks with the MSK data bit intervals.

2. The system of claim 1, further comprising an MSK RF subsystem for converting an MSK signal to an MSK input signal to be received by the complex mixer.

3. The system of claim 1, wherein the carrier synchronizer comprises:
- a first mixer for multiplying together the output of the I and Q signal accumulators to produce a first signal;
- a second mixer for multiplying together a cosine data clock generated by the MSK data clock generator with the first signal to produce a second signal;
- an accumulator for accumulating the second signal over one or more whole data bit intervals to produce a carrier clock error signal; and
- a filter for filtering the carrier clock error signal used for synchronizing the reference carrier.

4. The system of claim 1, wherein the data clock synchronizer comprises:
- accumulators for separately accumulating over one data bit interval the outputs of the I and Q signal accumulators;
- a subtractor for computing the difference of the absolute values of the outputs of the accumulators of the data clock synchronizer to produce a first signal;
- a mixer for multiplying together a sine data clock generated by the MSK data clock generator with the first signal to produce a data clock error signal; and
- a filter for filtering the data clock error signal used for synchronizing the MSK data clocks.

5. The system of claim 1, further comprising a decoder for decoding the MSK signal.

6. The system of claim 5, wherein the decoder comprises:
- accumulators for separately accumulating over two data bit intervals the outputs of the I and Q signal accumulators; the accumulation interval of one accumulator of said decoder being staggered in time from the accumulation interval of the other accumulator of said decoder by one data bit interval.

7. A system for processing an MSK signal comprising:
- a complex mixer for mixing an MSK input signal with a reference carrier to produce signals in phase and in quadrature with the reference carrier; the complex mixer further comprising a reference carrier generator for generating the reference carrier; and
- an I signal accumulator for accumulating the in phase signal received from the complex mixer and a Q signal accumulator for accumulating the in quadrature signal received from the complex mixer; and
- a processor operating under the direction of software instructions, said processor comprising:
  - an MSK data clock generator for generating MSK data clocks;
  - a carrier synchronizer for generating a carrier clock error signal for synchronizing the reference carrier with the center frequency of the MSK input signal; and
  - a data clock synchronizer for generating a data clock error signal for synchronizing the MSK data clock with the MSK data bit intervals.

8. The system of claim 7, wherein said processor further comprises a decoder for decoding the MSK signal.

9. A system for processing an MSK signal comprising:
- an MSK data clock generator for generating MSK data clocks;
- a complex mixer for receiving in phase and in quadrature MSK signals at an intermediate frequency and mixing said in phase and quadrature signals with a reference carrier to produce in phase and in quadrature signals at baseband; the complex mixer further comprising a reference carrier generator for generating the reference carrier;
- an I signal accumulator for accumulating the in phase signal received from the complex mixer and a Q signal accumulator for accumulating the in-quadrature signal received from the complex mixer;
- a carrier synchronizer for generating a carrier clock error signal for synchronizing the reference carrier with the center frequency of the MSK input signal; and
- a data clock synchronizer for generating a data clock error signal for synchronizing the MSK data clocks with the MSK data bit intervals.

10. A system for processing an MSK signal using a GPS receiver apparatus comprising:
- a GPS correlator channel for receiving an MSK input signal and for outputting an in-phase signal and an in-quadrature signal;
- an MSK data clock generator for generating MSK data clocks; said MSK data clock generator responsive to an epoch timing signal received from the GPS correlator channel for synchronizing the MSK data clock generator with the code DCO of the GPS correlator channel;
- a de-spread controller for disabling the GPS correlator channel process of de-spreading by a PRN code;
- a carrier synchronizer for generating a carrier clock error signal for synchronizing the carrier DCO of the GPS correlator channel with the center frequency of the MSK input signal; and
- a data clock synchronizer for generating a data clock error signal for synchronizing the code DCO of the GPS correlator channel with the MSK signal data bit intervals.

11. The system of claim 10, wherein the carrier synchronizer comprises:
- a first mixer for multiplying together the in phase and in quadrature signals from the GPS correlator channel to produce a first signal;
- a second mixer for multiplying together a cosine data clock generated by the MSK data clock generator with the first signal to produce a second signal;
- an accumulator for accumulating the second signal over one or more whole data bit intervals to produce a carrier clock error signal; and
- a filter for filtering the carrier clock error signal used for synchronizing the carrier DCO.

12. The system of claim 10, wherein an even integer multiple of epochs is about equal to one data bit interval.

13. The system of claim 10, wherein the data clock synchronizer comprises:
- accumulators for separately accumulating over one data bit interval the in phase and in quadrature signals received from the GPS correlator channel;
- a subtractor for computing the difference of the absolute values of the outputs of the accumulators of the data synchronizer to produce a first signal;
- a mixer for multiplying together a sine data clock generated by the MSK data clock generator with the first signal to produce a data clock error signal; and
- a filter for filtering the data clock error signal used for synchronizing the code DCO of the GPS correlator channel.

14. The system of claim 10, further comprising a decoder for decoding the MSK signal.

15. The system of claim 14, wherein the decoder comprises:

accumulators for separately accumulating over two data bit intervals the in phase and in quadrature signals from the GPS correlator channel; the accumulation interval of one accumulator of said decoder being staggered in time from the accumulation interval of the other accumulator of said decoder by one data bit interval.

16. A system for processing an MSK signal using a GPS receiver apparatus comprising:

a GPS correlator channel for receiving an MSK input signal and for outputting an in-phase signal and an in-quadrature signal; and a processor operating under the direction of software instructions, said processor comprising:

an MSK data clock generator for generating MSK data clocks; said MSK data clock generator responsive to an epoch timing signal received from a GPS correlator channel for synchronizing the MSK data clock generator with the code DCO of the GPS receiver channel;

a de-spread controller for disabling the GPS correlator channel process of de-spreading by a PRN code;

a carrier synchronizer for generating a carrier clock error signal for synchronizing the carrier DCO of the GPS correlator channel with the center frequency of the MSK input signal; and a data clock synchronizer for generating a data clock error signal for synchronizing the code DCO of the GPS correlator channel with the MSK signal data bit intervals.

17. The system of claim 16, wherein said processor further comprises a decoder for decoding the MSK signal.

18. The system of claim 16, wherein said processor is a GPS receiver processor for controlling GPS correlator channels and processing GPS satellite data.

19. A system for processing an MSK signal using a GPS receiver apparatus comprising:

a GPS correlator channel for receiving in phase and in quadrature MSK signals at an intermediate frequency and outputting in phase and in quadrature signals at baseband;

an MSK data clock generator for generating MSK data clocks; said MSK data clock generator responsive to an epoch timing signal received from the GPS correlator channel for synchronizing the MSK data clock generator with the code DCO of the GPS correlator channel;

a de-spread controller for disabling the GPS correlator channel process of de-spreading by a PRN code;

a carrier synchronizer for generating a carrier clock error signal for synchronizing the carrier DCO of the GPS correlator channel with the center frequency of the MSK input signal; and a data clock synchronizer for generating a data clock error signal for synchronizing the code DCO of the GPS correlator channel with the MSK signal data bit intervals.

20. A method for processing an MSK signal comprising the steps of:

generating a reference carrier;

complex mixing an MSK input signal with the reference carrier to produce a signal in phase with the reference carrier and a signal in quadrature with the reference carrier;

generating MSK data clocks;

accumulating the in phase signal to form an I signal accumulation; accumulating the in quadrature phase signal to form a Q signal accumulation;

synchronizing the reference carrier with the center frequency of the MSK input signal; and synchronizing the MSK data clock with the MSK data bit intervals.

21. The method of claim 20, further comprising the step of converting an MSK signal to an MSK input signal to be mixed with the reference carrier.

22. The method of claim 21, wherein the step of converting the MSK signal to an MSK input signal comprises the steps of:

downconverting the MSK signal;

filtering the downconverted MSK signal; and quantizing the filtered signal.

23. The method of claim 22, wherein the filtering bandwidth is adjusted according to the data bit rate of the MSK signal.

24. The method of claim 20, wherein the step of synchronizing the reference carrier with the center frequency of the MSK input signal further comprises:

multiplying together the I signal accumulation and the Q signal accumulation to produce a first signal;

multiplying together the cosine data clock of the MSK data clocks with the first signal to produce a second signal;

accumulating the second signal over an interval of one or more whole data bit intervals to produce a carrier clock error signal; and adjusting the reference carrier to minimize the carrier clock error signal.

25. The method of claim 24, wherein the carrier clock error signal is filtered before the step of adjusting the reference carrier.

26. The method of claim 20, wherein an even integer number of the intervals of accumulation of the in phase and in quadrature signals produced by the step of mixing the MSK input signal with the reference carrier is about equal to one data bit interval.

27. The method of claim 20, wherein the step of synchronizing the MSK data clock with the MSK data bit intervals comprises;

separately accumulating the I and Q signal accumulations over one data bit interval;

computing the difference of the absolute values of each accumulation to produce a first signal;

multiplying together the sine data clock of the MSK data clocks with the first signal to produce a data clock error signal; and adjusting the MSK data clock to minimize the data clock error signal.

28. The method of claim 27, wherein the data clock error signal is filtered before the step of adjusting the MSK data clock.

29. The method of claim 20, further comprising the step of decoding the MSK signal.

30. The method of claim 29, wherein the step of decoding the MSK signal comprises the step of:

accumulating the I and Q signal accumulations over two data bit intervals; the intervals of the in phase accumulation being staggered from the intervals of the in quadrature phase accumulation by one data bit.

31. A method for processing an MSK signal comprising the steps of:

generating a reference carrier;

complex mixing an MSK input signal with the reference carrier to produce a signal in phase with the reference carrier and a signal in quadrature with the reference carrier; and providing a processor operating under the direction of software instructions for:

generating MSK data clocks;

separately accumulating the in phase and in quadrature signals;

synchronizing the reference carrier with the center frequency of the MSK input signal; and synchronizing the MSK data clocks with the MSK data bit intervals.

32. The method of claim 31, wherein said processor further operates under the direction of software instructions for decoding the MSK signal.

33. A method for processing an MSK signal comprising the steps of:

generating a reference carrier;

mixing an in phase MSK signal at an intermediate frequency with the reference carrier to produce an in phase signal at baseband;

mixing an in quadrature MSK signal at an intermediate frequency with the reference carrier to produce an in quadrature signal at baseband;

generating MSK data clocks;

accumulating the in phase signal at baseband to form an I signal accumulation; accumulating the in quadrature phase signal at baseband to form a Q signal accumulation;

synchronizing the reference carrier with the center frequency of the MSK input signal; and synchronizing the MSK data clock with the MSK data bit intervals.

34. A method for using a GPS receiver apparatus for processing an MSK signal comprising the steps of:

inputting an MSK input signal to a GPS correlator channel for generating a signal in phase with a reference carrier and a signal in quadrature with said reference carrier;

generating MSK data clocks in response to an epoch timing signal received from the GPS correlator channel;

disabling the GPS correlator channel process of de-spreading by a PRN code;

synchronizing the carrier DCO of the GPS correlator channel with the center frequency of the MSK input signal; and synchronizing the code DCO of the GPS correlator channel with the MSK data bit intervals.

35. The method of claim 34, further comprising the step of converting an MSK signal into an MSK input signal to be mixed with the reference carrier generated by the carrier DCO of the GPS correlator channel.

36. The method of claim 35, wherein the step of converting the MSK signal to a signal to be input to a GPS receiver channel comprises the steps of:

downconverting the MSK signal;

filtering the downconverted MSK signal; and quantizing the filtered signal.

37. The method of claim 36, wherein the filtering bandwidth is adjusted according to the data bit rate of the MSK signal.

38. The method of claim 34, wherein the step of synchronizing the carrier DCO with the center frequency of the MSK input signal comprises the steps of:

multiplying together the in phase and in quadrature signals from the GPS correlator channel to produce a first signal;

multiplying together the cosine data clock of the MSK data clocks with the first signal to produce a second signal;

accumulating the second signal over one or more whole data bit intervals to produce a carrier clock error signal;

filtering the carrier clock error signal; and adjusting the carrier DCO to minimize the filtered carrier clock error signal.

39. The method of claim 34, further comprising the step of adjusting the epoch interval so that an even integer multiple of epochs is about equal to one data bit interval.

40. The method of claim 34, wherein the step of synchronizing the code DCO of the GPS correlator channel with the MSK data bit intervals comprises the steps of:

separately accumulating the in phase and in quadrature signals over one data bit interval;

computing the difference of the absolute values of each accumulation to produce a first signal;

multiplying together the sine data clock of the MSK data clocks with the first signal to produce a data clock error signal;

filtering the carrier clock error signal; and adjusting the code DCO to minimize the filtered data clock error signal.

41. The method of claim 34, further comprising the step of decoding the MSK signal.

42. The method of claim 41, wherein the step of decoding the MSK signal comprises the step of:

separately accumulating the in phase and in quadrature signals from the GPS correlator channel over two data bit intervals; the intervals of the in phase accumulation being staggered from the intervals of the quadrature accumulation by one data bit.

43. The method of claim 42, wherein the step of decoding the MSK signal further comprises the steps of:

separately latching each of the accumulations;

inputting the latched accumulations to a first XOR gate;

quantizing a sine data clock derived from the MSK data clock;

inputting the quantized sine data clock and the output of the first XOR gate to a second XOR gate; and sampling the output of the second XOR gate at the end of each data bit interval.

44. The method of claim 34, further comprising the step of tuning the reference frequency generated by the carrier DCO of the GPS correlator channel to be about equal to the center frequency of the MSK input signal.

45. The method of claim 34, further comprising the step of tuning the MSK data clock frequency to be about equal to the data bit rate of the MSK signal.

46. The method of claim 34, wherein the step of disabling the GPS correlator channel process of de-spreading by a PRN code comprises the step of causing the in phase and in quadrature signals in the GPS correlator channel to be correlated with a value that is constant over the duration of each epoch.

47. The method of claim 34, wherein the step of disabling the GPS correlator channel process of de-spreading by a PRN code comprises the step of causing the GPS correlator channel code generator to output a code sequence that is a constant value over the duration of each epoch.

48. A method for using a GPS receiver apparatus for processing an MSK signal comprising the steps of:
- inputting in phase and in quadrature MSK signals at an intermediate frequency into a GPS correlator channel for generating an in phase signal at baseband and an in quadrature signal at baseband;
- generating MSK data clocks in response to an epoch timing signal received from the GPS correlator channel;
- disabling the GPS correlator channel process of de-spreading by a PRN code;
- synchronizing the carrier DCO of the GPS correlator channel with the center frequency of the MSK input signal; and
- synchronizing the code DCO of the GPS correlator channel with the MSK data bit intervals.

49. A method for using a GPS receiver apparatus for processing an MSK signal comprising the steps of:
- inputting an MSK input signal to a non-de-spreading GPS correlator channel for generating a signal in phase with a reference carrier and a signal in quadrature phase with said reference carrier;
- generating MSK data clocks in response to an epoch timing signal received from the GPS correlator channel;
- synchronizing the carrier DCO of the GPS correlator channel with the center frequency of the MSK input signal; and
- synchronizing the code DCO of the GPS correlator channel with the MSK data bit intervals.

50. A method for using a GPS receiver apparatus for processing an MSK signal comprising the steps of:
- spreading an MSK signal by a PRN code prior to inputting said MSK signal to a GPS correlator channel;
- inputting the spread MSK input signal to a GPS correlator channel for generating a signal in phase with a reference carrier and a signal in quadrature phase with said reference carrier, wherein said in phase and in quadrature signals are de-spreaded by said GPS correlator channel;
- generating MSK data clocks in response to an epoch timing signal received from the GPS correlator channel;
- synchronizing the carrier DCO of the GPS correlator channel with the center frequency of the MSK input signal; and
- synchronizing the code DCO of the GPS correlator channel with the MSK data bit intervals.

51. A method for using a GPS receiver apparatus for processing an MSK signal comprising the steps of:
- inputting an MSK input signal to a GPS correlator channel; and
- providing a processor operating under the direction of software instructions for:
  - generating MSK data clocks in response to an epoch timing signal received from the GPS correlator channel;
  - disabling the GPS receiver channel process of de-spreading by a PRN code;
  - synchronizing the carrier DCO of the GPS correlator channel with the center frequency of the MSK input signal; and
  - synchronizing the code DCO of the GPS correlator channel with the MSK data bit intervals.

52. The method of claim 51, wherein said processor further operates under the direction of software instructions for decoding the MSK signal.

53. The method of claim 51, wherein said processor further operates under the direction of software instructions for tuning the carrier frequency generated by the carrier DCO of the GPS correlator channel to about equal to the center frequency of the MSK input signal.

54. The method of claim 51, wherein said processor further operates under the direction of software instructions for tuning the MSK data clock frequency to be about equal to the data bit rate of the MSK signal.

55. The method of claim 51, wherein said processor is a GPS receiver processor for controlling GPS correlator channels and processing GPS satellite signals.

* * * * *